United States Patent
Wang et al.

(10) Patent No.: US 11,152,219 B2
(45) Date of Patent: Oct. 19, 2021

(54) SELECTIVELY ETCHING MATERIALS

(71) Applicant: ENTEGRIS, INC., Billerica, MA (US)

(72) Inventors: Chieh Ju Wang, Tainan (TW); Hsing-Chen Wu, Yonghe (TW); Chia-Jung Hsu, Taipei (TW)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 16/443,492

(22) Filed: Jun. 17, 2019

(65) Prior Publication Data
US 2020/0013633 A1 Jan. 9, 2020

Related U.S. Application Data

(60) Provisional application No. 62/694,578, filed on Jul. 6, 2018.

(51) Int. Cl.
| | |
|---|---|
| H01L 21/3213 | (2006.01) |
| H01L 21/311 | (2006.01) |
| H01L 21/306 | (2006.01) |
| C09K 13/08 | (2006.01) |
| C09K 13/06 | (2006.01) |

(52) U.S. Cl.
CPC ........ *H01L 21/31111* (2013.01); *C09K 13/08* (2013.01); *H01L 21/30604* (2013.01); *H01L 21/31105* (2013.01); *H01L 21/31116* (2013.01); *H01L 21/31122* (2013.01); *H01L 21/3213* (2013.01); *H01L 21/32133* (2013.01); *H01L 21/32134* (2013.01)

(58) Field of Classification Search
None
See application file for complete search history.

(56) References Cited

U.S. PATENT DOCUMENTS

| | | | | |
|---|---|---|---|---|
| 6,835,667 | B2 * | 12/2004 | Christenson | H01L 21/31111 438/745 |
| 7,943,562 | B2 * | 5/2011 | Lee | C11D 7/3209 510/175 |
| 8,440,525 | B2 * | 5/2013 | Shea | H01L 21/32134 438/253 |
| 2003/0235985 | A1 | 12/2003 | Christenson | |
| 2006/0043451 | A1 | 3/2006 | Shea | |
| 2009/0093107 | A1 | 4/2009 | Lee | |
| 2014/0038420 | A1 * | 2/2014 | Chen | H01L 21/32134 438/754 |
| 2015/0075570 | A1 | 3/2015 | Wu | |
| 2015/0159125 | A1 | 6/2015 | Kneer | |
| 2016/0032186 | A1 | 2/2016 | Chen | |

(Continued)

FOREIGN PATENT DOCUMENTS

| | | |
|---|---|---|
| CN | 1802731 A | 7/2006 |
| CN | 101000469 A | 7/2007 |

(Continued)

*Primary Examiner* — Stephanie P Duclair (57) ABSTRACT

A method of selectively removing aluminium oxide or nitride material from a microelectronic substrate, the method comprising contacting the material with an aqueous etching composition comprising: an etchant comprising a source of fluoride; and a metal corrosion inhibitor; wherein the composition has a pH in the range of from 3 to 8. Aqueous etching compositions and uses are also described.

16 Claims, 3 Drawing Sheets

| No | DIW (w/w) | pH adjustor 2 (w/w) | heterocyclic nitrogen compound 1 (w/w) | Fluoride releasing acid (w/w) | Sulfoxide (w/w) | Glycol (w/w) | Organic ether 1 (w/w) | Organic ether 2 (w/w) | Organic carbonate ester (w/w) | Cationic surfactant (w/w) | pH | dil pH | Co etch - Å/min | Al₂O₃ etch - Å/min |
|---|---|---|---|---|---|---|---|---|---|---|---|---|---|---|
| 1 | 90-100 | 0.3-0.4 | 0.3-0.6 | <0.1 | | | | | | <0.1 | 3-5 | 3-5 | 0.2 | 140 |
| 2 | 90-100 | 0.3-0.4 | 0.3-0.6 | <0.1 | 2-3 | | | | | <0.1 | 3-5 | 3-5 | 0.2 | 138 |
| 3 | 90-100 | 0.3-0.4 | 0.3-0.6 | <0.1 | | 2-3 | | | | <0.1 | 3-5 | 3-5 | 0.1 | 145 |
| 4 | 70-80 | 0.3-0.4 | 0.3-0.6 | <0.1 | | 20-30 | | | | <0.1 | 3-5 | 3-5 | 1.8 | n/a |
| 5 | 90-100 | 0.3-0.4 | 0.3-0.6 | <0.1 | | | 4-6 | | | <0.1 | 3-5 | 3-5 | 0.1 | 169 |
| 6 | 90-100 | 0.3-0.4 | 0.3-0.6 | <0.1 | | | | 4-6 | | <0.1 | 3-5 | 3-5 | 0.3 | 135 |
| 7 | 90-100 | 0.3-0.4 | 0.3-0.6 | <0.1 | | | | | 2-4 | <0.1 | 3-5 | 3-5 | 0.3 | 160 |

Table 1

(56) References Cited

U.S. PATENT DOCUMENTS

| | | | |
|---|---|---|---|
| 2016/0099158 A1* | 4/2016 | Orozco-teran | H01L 21/02063 |
| | | | 438/754 |
| 2016/0130500 A1 | 5/2016 | Chen et al. | |
| 2016/0186105 A1 | 6/2016 | Liu | |
| 2017/0200601 A1 | 7/2017 | Song et al. | |

FOREIGN PATENT DOCUMENTS

| | | | |
|---|---|---|---|
| CN | 104145324 A | | 11/2014 |
| JP | 2017108122 A | | 6/2017 |
| KR | 20160042259 A | | 4/2016 |
| TW | 573867 A | | 7/2016 |
| WO | 2014138064 A1 | | 9/2014 |
| WO | 2015187675 A2 | | 12/2015 |
| WO | 2016042408 | * | 3/2016 |

* cited by examiner

| No | DIW (w/w) | pH adjustor 2 (w/w) | heterocyclic nitrogen compound 1 (w/w) | Fluoride releasing acid (w/w) | Sulfoxide (w/w) | Glycol (w/w) | Organic ether 1 (w/w) | Organic ether 2 (w/w) | Organic carbonate ester (w/w) | Cationic surfactant (w/w) | pH | dil pH | Co etch - Å/min | Al₂O₃ etch - Å/min |
|---|---|---|---|---|---|---|---|---|---|---|---|---|---|---|
| 1 | 90-100 | 0.3-0.4 | 0.3-0.6 | <0.1 | | | | | | <0.1 | 3-5 | 3-5 | 0.2 | 140 |
| 2 | 90-100 | 0.3-0.4 | 0.3-0.6 | <0.1 | 2-3 | | | | | <0.1 | 3-5 | 3-5 | 0.2 | 138 |
| 3 | 90-100 | 0.3-0.4 | 0.3-0.6 | <0.1 | | 2-3 | | | | <0.1 | 3-5 | 3-5 | 0.1 | 145 |
| 4 | 70-80 | 0.3-0.4 | 0.3-0.6 | <0.1 | | 20-30 | | | | <0.1 | 3-5 | 3-5 | 1.8 | n/a |
| 5 | 90-100 | 0.3-0.4 | 0.3-0.6 | <0.1 | | | 4-6 | | | <0.1 | 3-5 | 3-5 | 0.1 | 169 |
| 6 | 90-100 | 0.3-0.4 | 0.3-0.6 | <0.1 | | | | 4-6 | | <0.1 | 3-5 | 3-5 | 0.3 | 135 |
| 7 | 90-100 | 0.3-0.4 | 0.3-0.6 | <0.1 | | | | | 2-4 | <0.1 | 3-5 | 3-5 | 0.3 | 160 |

Table 1

FIG. 1

| No | DIW (w/w) | pH adjustor 2 (w/w) | heterocyclic nitrogen compound 1 (w/w) | heterocyclic nitrogen compound 2 (w/w) | Fluoride releasing acid (w/w) | Glycol (w/w) | Cationic surfactant (w/w) | pH | dil pH | Co etch - Å/min | Al$_2$O$_3$ etch - Å/min | AlN etch - Å/min | W etch - Å/min |
|---|---|---|---|---|---|---|---|---|---|---|---|---|---|
| 8 | 90-100 | 0.3-0.4 | 0.3-0.5 | | <0.1 | 2-3 | <0.1 | 3-5 | 3-5 | 0.5 | 152 | 53 | 1 |
| 9 | 90-100 | 0.3-0.4 | | 0.4-0.6 | <0.1 | 2-3 | <0.1 | 3-5 | 3-5 | 0.4 | n/a | n/a | n/a |
| 10 | 90-100 | 0.3-0.4 | 0.4-0.6 | | <0.1 | 2-3 | <0.1 | 3-5 | 3-5 | 0.1 | 145 | n/a | n/a |
| 11 | 90-100 | 0.3-0.4 | 0.3-0.5 | 0.05-0.15 | <0.1 | 2-3 | <0.1 | 3-5 | 3-5 | 0.3 | 156 | n/a | n/a |

Table 2

FIG. 2

| No | DIW (w/w) | pH adjustor 1 | heterocyclic nitrogen compound 1 (w/w) | Fluoride releasing acid (w/w) | Cationic surfactant (w/w) | pH | dil pH | Co etch - Å/min | Al$_2$O$_3$ etch - Å/min |
|----|-----------|---------------|----------------------------------------|-------------------------------|---------------------------|-----|--------|-----------------|--------------------------|
| 12 | 90-100 | 0.4-0.6 | | <0.1 | <0.1 | 3-5 | n/a | 1.6 | 93 |
| 13 | 90-100 | | 0.4-0.6 | <0.1 | <0.1 | 1-3 | n/a | 5.4 | 91 |
| 14 | 90-100 | 0.4-0.6 | 0.4-0.6 | <0.1 | <0.1 | 3-5 | 3-5 | 0.2 | n/a |

Table 3

FIG. 3

SELECTIVELY ETCHING MATERIALS

TECHNICAL FIELD

This invention relates to methods and compositions for selectively removing material from microelectronic substrates. In particular, though not exclusively, the invention relates to methods and compositions for selectively removing aluminium oxide from microelectronic substrates.

BACKGROUND

There are various requirements in the semiconductor industry to etch or remove certain materials selectively at different times using a wet etching process.

For example, with the decreasing size of microelectronic devices, it becomes more difficult to achieve the critical dimensions for vias and trenches. Thus, hard masks and etch stop layers are used to provide better profile control of vias and trenches. It is known to make hard masks and etch stop layers of titanium or titanium nitride, and to remove these by a wet etching process after forming a via and/or trench.

It is essential that wet etching processes use a removal chemistry that effectively removes the correct material without adversely affecting an underlying metal conductor layer and/or low-k dielectric material. In other words, the removal chemistry is required to be selective.

Recent fabrication approaches have been making use of aluminium oxide dry etch stop layers, which subsequently require removal by wet etching. In some applications, such removal must occur without adversely affecting tungsten and/or cobalt.

In this context there is a need for new compositions for selectively removing aluminium oxide from microelectronic substrates, e.g. in the presence of tungsten and/or cobalt.

It is an object to provide compositions and methods for removing material from microelectronic substrates.

SUMMARY OF THE INVENTION

Aspects of the invention relate to methods of selectively removing material from microelectronic substrates by contact with an aqueous etching composition.

A first aspect of the invention provides a method of selectively removing aluminium oxide or nitride material from a microelectronic substrate, the method comprising contacting the material with an aqueous etching composition comprising: an etchant comprising a source of fluoride; and a metal corrosion inhibitor; wherein the composition has a pH in the range of from 3 to 8.

It has been found that this method can achieve usefully high etch rates for removal of aluminium oxide or nitride material. Usefully low etch rates for metals (e.g. tungsten, cobalt) and low-k dielectric materials, such as may be present in the microelectronic substrate, may also be achieved.

Aspects of the invention also relate to the aqueous etching compositions themselves.

A second aspect of the invention provides an aqueous etching composition comprising: an etchant comprising a source of fluoride; and a metal corrosion inhibitor; wherein the composition has a pH in the range of from 3 to 8.

Furthermore, aspects of the invention relate to the use of aqueous etching compositions to achieve desired results.

A third aspect of the invention provides the use in an etching process of an aqueous etching composition comprising: an etchant comprising a source of fluoride; and a metal corrosion inhibitor; wherein the composition has a pH in the range of from 3 to 8, for the purpose of achieving a higher etch rate of aluminium oxide or nitride material compared to an etch rate of a metal or low-k dielectric material.

Particular embodiments of the invention can provide particular benefits in performance or customization, as set out in the detailed description below.

Features of each aspect of the invention may be as described in connection with any of the other aspects. Within the scope of this application it is expressly intended that the various aspects, embodiments, examples and alternatives set out herein, and in particular the individual features thereof, may be taken independently or in any combination. That is, all embodiments and/or features of any embodiment can be combined in any way and/or combination, unless such features are incompatible.

BRIEF DESCRIPTION OF DRAWINGS

The disclosure may be more completely understood in consideration of the following description of various illustrative embodiments in connection with the accompanying drawings.

DETAILED DESCRIPTION

Various aspects of the invention relate to an aqueous etching composition comprising: an etchant comprising a source of fluoride; and a metal corrosion inhibitor; wherein the composition has a pH in the range of from 3 to 8.

The composition may advantageously be used for selectively removing or etching material from a microelectronic substrate. Advantageous results have been achieved when removing aluminium oxide or nitride material from the microelectronic substrate. However, the composition can also be used to remove other materials.

The term "microelectronic substrate" is used herein to include any substrate or structure that is or will eventually become a microelectronic device or microelectronic assembly. Non-limiting examples include semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications.

Microelectronic substrates often comprise metals, for example tungsten, cobalt, copper or ruthenium. Advantageously, the composition may be tailored to preserve such metals.

Microelectronic substrates also comprise low-k dielectric materials. Such materials can have a dielectric constant less than about 3.5. Suitably, low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

The term, "aluminium oxide or nitride material" is used herein to refer to compounds in which aluminium is combined with at least one of oxygen and nitrogen. Such compounds may have any valid stoichiometry. Thus the material may comprise or consist of: aluminium oxide in any stoichiometry; aluminium nitride in any stoichiometry; aluminium oxynitride in any stoichiometry; or combinations thereof. In various embodiments, the material comprises or consists of aluminium oxide or aluminium nitride. In various embodiments, the material comprises or consists of aluminium oxide.

In various embodiments, the composition may be used to selectively remove material (for example aluminium oxide or nitride material) whilst minimising etching of metal and/or low-k dielectric materials. Non-limiting examples of metals for which etching may be advantageously minimised are tungsten, cobalt, copper and ruthenium. However, the composition may also be tailored to minimise etching of other materials.

The composition comprises an etchant comprising a source of fluoride. Etchant is included to enhance the etch rate at which material can be removed by the composition.

Suitably, the composition may comprise an etchant component consisting of a plurality of etchants. Suitably, the etchant component may consist of a plurality of etchants that provide a source of fluoride. Sources of fluoride include ionic fluoride ($F^-$) and covalently bonded fluorine. Thus fluoride may be included as a species or generated in situ.

In some embodiments the etchants include, but are not limited to, HF, ammonium fluoride, tetrafluoroboric acid, hexafluorosilicic acid, other compounds containing B—F or Si—F bonds, tetrabutylammonium tetrafluoroborate, tetraalkylammonium fluorides and combinations thereof. Suitably the etchant may be a fluorine releasing acid. Conveniently, an etchant may be selected from HF, ammonium fluoride and tetraalkylammonium fluorides.

Suitably, the composition may be substantially devoid of tetraalkylammonium fluorides.

In various embodiments the composition comprises in the range of from 0.001 to 0.5 wt./wt. % based on the total weight of the composition, of an etchant or etchant component as described anywhere herein. Suitably, the amount of etchant or etchant component may be in the range of from 0.01 to 0.1 wt./wt. %.

The etchant or etchant component may be the sole etchant in the composition. In various embodiments the etchant may be in the range of from 0.001 to 0.5 wt./wt. %, based on the total weight of the composition, suitably in the range of from 0.01 to 0.1 wt./wt. %.

The composition comprises a metal corrosion inhibitor. Metal corrosion inhibitor is included to mitigate etching or removal of one or more metals, such as may be present in the microelectronic substrate. Suitably, the composition may comprise a metal corrosion inhibitor component consisting of a plurality of metal corrosion inhibitors.

Metal corrosion inhibitors of use in the composition include, but are not limited to, 5-amino-1,3,4-thiadiazole-2-thiol (ATDT), 2-amino-5-ethyl-1,3,4-thiadiazole, benzotriazole (BTA), 1,2,4-triazole (TAZ), tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dedecyl sulfate (SDS), ATA-SDS, 3-amino-5-mercapto-1,2,4-triazole, 3,5-diamino-1,2,4-triazole, pentylenetetrazole, 5-phenyl-1H-tetrazole, 5-benzyl-1H-tetrazole, 5-methyltetrazole, 5-mercapto-1-methyl-tetrazole, 1-phenyl-1H-tetrazole-5-thiol, Ablumine O (Taiwan Surfactant), 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, benzimidazole, 2-aminobenzimidazole, 1-methylimidazole, indiazole, adenine, succinimide, adenosine, carbazole, saccharin, uric acid, and benzoin oxime. Additional corrosion inhibitors include cationic quaternary salts such as benzalkonium chloride, benzyldimethyldodecylammonium chloride, myristyltrimethylammonium bromide, dodecyltrimethylammonium bromide, hexadecylpyridinium chloride, Aliquat 336 (Cognis), benzyldimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, decyltrimethylammonium Chloride (DTAC), ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, cetyltrimethylammonium bromide, myristyltrimethylammonium bromide, and hexamethonium chloride and combinations thereof.

The particular nature of the metal corrosion inhibitor can be tailored to desired applications or metals. In various embodiments, a heterocyclic nitrogen compound may be employed as the corrosion inhibitor.

In various embodiments, an optionally substituted benzotriazole corrosion inhibitor may be used. Suitable substituents for benzotriazole may, for example, be deduced from the above-listed compounds. In various embodiments, the optionally substituted benzotriazole corrosion inhibitor comprises 5-methyl-benzotriazole.

Other metal corrosion inhibitors of use in the composition include non-ionic surfactants such as PolyFox PF-159 (OM-NOVA Solutions), poly(ethylene glycol) ("PEG"), poly(propylene glycol) ("PPG"), ethylene oxide/propylene oxide block copolymers such as Pluronic F-127 (BASF), polyoxyethylene (20) sorbitan monooleate (Tween 80), polyoxyethylene (20) sorbitan monopalmitate (Tween 40), polyoxyethylene (20) sorbitan monolaurate (Tween 20), polyoxypropylene/polyoxyethylene block copolymers such as Pluronic L31, Pluronic 31R1, Pluronic 25R2 and Pluronic 25R4, anionic surfactants such as dodecylbenzenesulfonic acid, sodium dodecylbenzenesulfonate, dodecylphosphonic acid (DDPA), bis(2-ethylhexyl)phosphate, benzylphosphonic acid, diphenylphosphinic acid, 1,2-ethylenediphosphonic acid, phenylphosphonic acid, cinnamic acid and combinations thereof.

Cationic surfactants may also be useful as metal corrosion inhibitors.

Advantageously, a quaternary ammonium salt or cation (quat) may be employed as a metal corrosion inhibitor. Quaternary ammonium salts can function as both corrosion inhibitors (e.g. for tungsten, copper, cobalt, and ruthenium) and wetting agents.

Suitably, the metal corrosion inhibitor may comprise a quaternary ammonium cation of formula (I):

wherein $R^1$, $R^2$, $R^3$ and $R^4$ are independently selected from quaternizing groups, and wherein $R^4$ comprises at least 8 carbon atoms.

Quaternizing groups include substituted or unsubstituted alkyl, alkoxy and aryl groups. Substituents may be of any suitable type known in the art.

Advantageously, $R^1$ may comprise a substituted or unsubstituted aryl quaternizing group, for example benzyl or phenyl.

Optionally $R^2$ and $R^3$ may be independently selected from substituted or unsubstituted alkyl or alkoxy groups, in particular groups having in the range of from 1 to 5 carbon atoms, more in particular 1 to 3 carbon atoms. Suitably, one or both of $R^2$ and $R^3$ may be methyl.

$R^4$ may suitably be an alkyl or alkoxy group and may optionally comprise at least 10 carbon atoms, at least 12 carbon atoms or even at least 14 carbon atoms.

For example, the quaternary ammonium cation may be of formula (II):

n = 8, 10, 12, 14, 16, 18

The anion of the quaternary ammonium salt may be of any suitable type. It will be obvious to those skilled in the art that, while quaternary salts are available commercially most often as chlorides or bromides, it is easy to ion-exchange the halide anion with non-halide anions such as sulfate, methanesulfonate, nitrate, hydroxide, etc. Such quaternary salts are also contemplated herein.

In various embodiments, a metal corrosion inhibitor component may comprise a mixture of quaternary ammonium cations, for example benzalkonium chloride.

In various embodiments, the composition comprises in the range of from 0.0001 to 2 wt./wt. % based on the total weight of the composition, of a metal corrosion inhibitor or metal corrosion inhibitor component as described anywhere herein. Suitably, the amount of metal corrosion inhibitor or metal corrosion inhibitor component may be in the range of from 0.001 to 1 wt./wt. %.

In various embodiments, the composition comprises in the range of from 0.1 wt./wt. % to 1 wt./wt. % of a metal corrosion inhibitor as described anywhere herein, for example an optionally substituted benzotriazole.

In various embodiments, the composition comprises in the range of from 0.001 wt./wt. % to 0.01 wt./wt. % of a metal corrosion inhibitor as described anywhere herein, for example a quaternary ammonium salt metal corrosion inhibitor.

The metal corrosion inhibitor or metal corrosion inhibitor component may be the sole metal corrosion inhibitor in the composition. In various embodiments the amount of metal corrosion inhibitor may be in the range of from 0.0001 to 2 wt./wt. %, based on the total weight of the composition, suitably in the range of from 0.001 to 1 wt./wt. %.

The composition has a pH in the range of from 3 to 8. Advantageously, the pH may be in the range of from 3 to 5, or in the range of from 3.5 to 4.5.

The composition may comprise a pH adjustor to ensure the desired pH range is achieved. The composition may comprise a pH adjustor component comprising one or more pH adjustors.

A pH adjustor may be of any suitable type. Suitably, a pH adjustor may comprise an ammonium salt. One example of a pH adjustor is ammonium sulphite.

Advantageously, a pH adjustor may be a pH buffering agent. As is known in the art, a pH buffering agent may be a weak acid or weak base (or salt thereof). One example of a suitable buffering agent is ammonium acetate.

In various embodiments, the composition comprises in the range of from 0.01 to 2%, based on the total weight of the composition, of a pH adjustor or pH adjustor component as described anywhere herein. Suitably, the amount of pH adjustor or pH adjustor component may be in the range of from 0.1 to 1 wt./wt. %.

The composition is aqueous and therefore comprises water which acts as a solvent. Suitably, water may make up a balancing amount of the composition.

In addition to water, the composition may comprise an organic solvent component comprising one or more water-miscible organic solvents. Suitable types of organic solvents include, for example, primary or secondary alcohols, sulfoxides, glycols, ureas, and ethers.

Suitable organic solvents include, methanol, ethanol, isopropanol, butanol, pentanol, hexanol, 2-ethyl-1-hexanol, heptanol, octanol, ethylene glycol, propylene glycol, butylene glycol, hexylene glycol, butylene carbonate, ethylene carbonate, propylene carbonate, choline bicarbonate, dipropylene glycol, dimethylsulfoxide, sulfolane, tetrahydrofurfuryl alcohol (THFA), 1,2-butanediol, 1,4-butanediol, tetramethyl urea, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, 4-methyl-2-pentanol, dimethyl sulfoxide (DMSO) and combinations thereof.

The presence of an organic solvent can enhance performance. In various embodiments, the composition comprises in the range of from 0.1 to 10 wt./wt. % based on the total weight of the composition, of an organic solvent or organic solvent component as described anywhere herein. Suitably, the amount of organic solvent or organic solvent component may be in the range of from 0.5 to 5 wt./wt. %.

The organic solvent or organic solvent component may be the sole organic solvent in the composition. In various embodiments the amount of metal organic solvent may be in the range of from 0.1 to 10 wt./wt. % based on the total weight of the composition, suitably in the range of from 0.5 to 5 wt./wt. %.

In an embodiment, the composition is substantially devoid of organic solvents.

The composition may be embodied in a wide variety of specific formulations, as obtainable by combining any of the defined components herein.

In various embodiments, the composition comprises the following combination of constituents (which may each be as further defined elsewhere herein and may make up an amount as defined elsewhere herein):
an etchant comprising a source of fluoride, optionally HF;
an optionally substituted benzotriazole metal corrosion inhibitor;
a quaternary ammonium salt metal corrosion inhibitor comprising a quaternary ammonium cation of formula (I):

wherein $R^1$, $R^2$, $R^3$ and $R^4$ are independently selected from quaternizing groups, and wherein $R^4$ comprises at least 8 carbon atoms;
a pH buffer; and
water.

The composition may also include further components where desired.

The composition may optionally include at least one low-k passivating agent to reduce chemical attack of low-k dielectric layers. Suitable low-k passivating agents include, but are not limited to, boric acid, borate salts, such as ammonium pentaborate, sodium tetraborate, 3-hydroxy-2-naphthoic acid, malonic acid, and iminodiacetic acid.

When present, the composition may include about 0.01 wt % to about 2 wt % low-k passivating agent, based on the total weight of the composition.

The composition may optionally include at least one silicon-containing compound to reduce the activity of the etchant source. In one embodiment, the at least one silicon-containing compounds comprises an alkoxysilane. Alkoxysilanes contemplated have the general formula $SiR^1R^2R^3R^4$, wherein the $R^1$, $R^2$, $R^3$ and $R^4$ are the same as or different from one another and are selected from the group consisting of straight-chained C1-C6 alkyl groups (e.g., methyl, ethyl, propyl, butyl, pentyl, hexyl), branched C1-C6 alkyl groups, C1-C6 alkoxy groups (e.g, methoxy, ethoxy, propoxy, butoxy, pentoxy, hexoxy), a phenyl group, and a combination thereof. It should be appreciated by the skilled artisan, that to be characterized as an alkoxysilane, at least one of $R^1$, $R^2$, $R^3$ or $R^4$ must be a C1-C6 alkoxy group. Alkoxysilanes contemplated include methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, and combinations thereof. Other silicon-containing compounds that can be used instead or in addition to the alkoxysilanes include ammonium hexafluorosilicate, sodium silicate, potassium silicate, tetramethyl ammonium silicate (TMAS), and combinations thereof. Preferably, the silicon-containing compound comprises TEOS, TMAS, and sodium silicate, potassium silicate.

When present, the amount of silicon-containing compound(s) is in the range from about 0.001 wt % to about 2 wt %, based on the total weight of the composition.

To ensure wetting a surfactant can be added to the aqueous composition, preferably an oxidation resistant, fluorinated anionic surfactant. Anionic surfactants contemplated in the compositions of the present invention include, but are not limited to, fluorosurfactants that are known in the industry and ammonium fluoroalkylsulfonates also known in the industry.

The composition may of course be substantially devoid of optional or further components, as explicitly described herein or more generally. Suitably, the composition may consist or consist essentially of constituents as defined anywhere herein.

Advantageously, the composition may be substantially devoid of oxidising agents. For example, the composition may be substantially devoid of peroxides.

"Substantially devoid" is defined throughout this specification as less than 1 wt %, preferably less than 0.5 wt %, more preferably less than 0.1 wt %, even more preferably less than 0.05 wt % or less than 0.01 wt %, and most preferably 0 wt %, based on the total weight of the composition.

The invention also embraces a method of selectively removing material from a microelectronic substrate, the method comprising contacting the material with an aqueous etching composition as described anywhere herein.

Various aspects of the invention relate to a method of selectively removing aluminium oxide or aluminium nitride material from a microelectronic substrate, the method comprising contacting the material with an aqueous etching composition comprising: an etchant comprising a source of fluoride; and a metal corrosion inhibitor; wherein the composition has a pH in the range of from 3 to 8.

It will be appreciated that it is common practice to make concentrated forms of the composition to be diluted prior to use. For example, the composition may be manufactured in a concentrated form and thereafter diluted with at least one solvent at the manufacturer, before use, and/or during use at the lab. Dilution ratios may be in a range from about 0.1 part diluent: 1 part composition concentrate to about 100 parts diluent: 1 part composition concentrate.

The method may be performed at any suitable temperature. Optionally, the temperature may be in the range of from 30 to 80° C., for example in the range of from 45 to 65° C.

The composition may be used in methods of the invention to achieve particular etch rates or particular etch ratios.

In various embodiments an aluminium oxide etch rate of at least 50 Angstroms/minute, or even at least 100 Angstroms/minute is achieved, optionally in an aluminium oxide etch test as defined below.

In various embodiments an aluminium nitride etch rate of at least 50 Angstroms/minute, or even at least 100 Angstroms/minute is achieved, optionally in an aluminium nitride etch test as defined below.

In various embodiments a tungsten etch rate of at most 4 Angstroms/minute, or even at most 2 Angstroms/minute is achieved, optionally in a tungsten etch test as defined below.

In various embodiments a cobalt etch rate of at most 4 Angstroms/minute, or even at most 2 Angstroms/minute is achieved, optionally in a cobalt etch test as defined below.

In various embodiments a low-k dielectric etch rate of at most 4 Angstroms/minute, or even at most 2 Angstroms/minute is achieved, optionally in a low-k dielectric etch test as defined below.

In various embodiments, the etch rate ratio between aluminium oxide and tungsten is at least 50:1, or advantageously at least 100:1.

In various embodiments, the etch rate ratio between aluminium oxide and cobalt is at least 50:1, or advantageously at least 100:1.

Various aspects of the invention relate to the use in an etching process of an aqueous etching composition as described anywhere herein, for the purpose of achieving a higher etch rate of aluminium oxide and/or aluminium nitride compared to an etch rate of a metal or low-k dielectric material.

The higher etch rate of aluminium oxide and/or aluminium nitride may in particular be compared to tungsten and/or cobalt.

Throughout this specification, the words "comprise" and "contain" and variations of the words, for example "comprising" and "comprises", mean "including but not limited to", and do not exclude other components, integers or steps. However, wherever the word "comprising" is used, an embodiment in which "comprising" is read as "consisting of" or "consisting essentially of" is also explicitly embraced.

Throughout this specification the singular encompasses the plural unless the context otherwise requires: in particular, where the indefinite article is used, the specification is to be understood as contemplating plurality as well as singularity, unless the context requires otherwise. The following non-limiting examples are provided by way of illustration only.

EXAMPLES

General methodology

Figure 1:
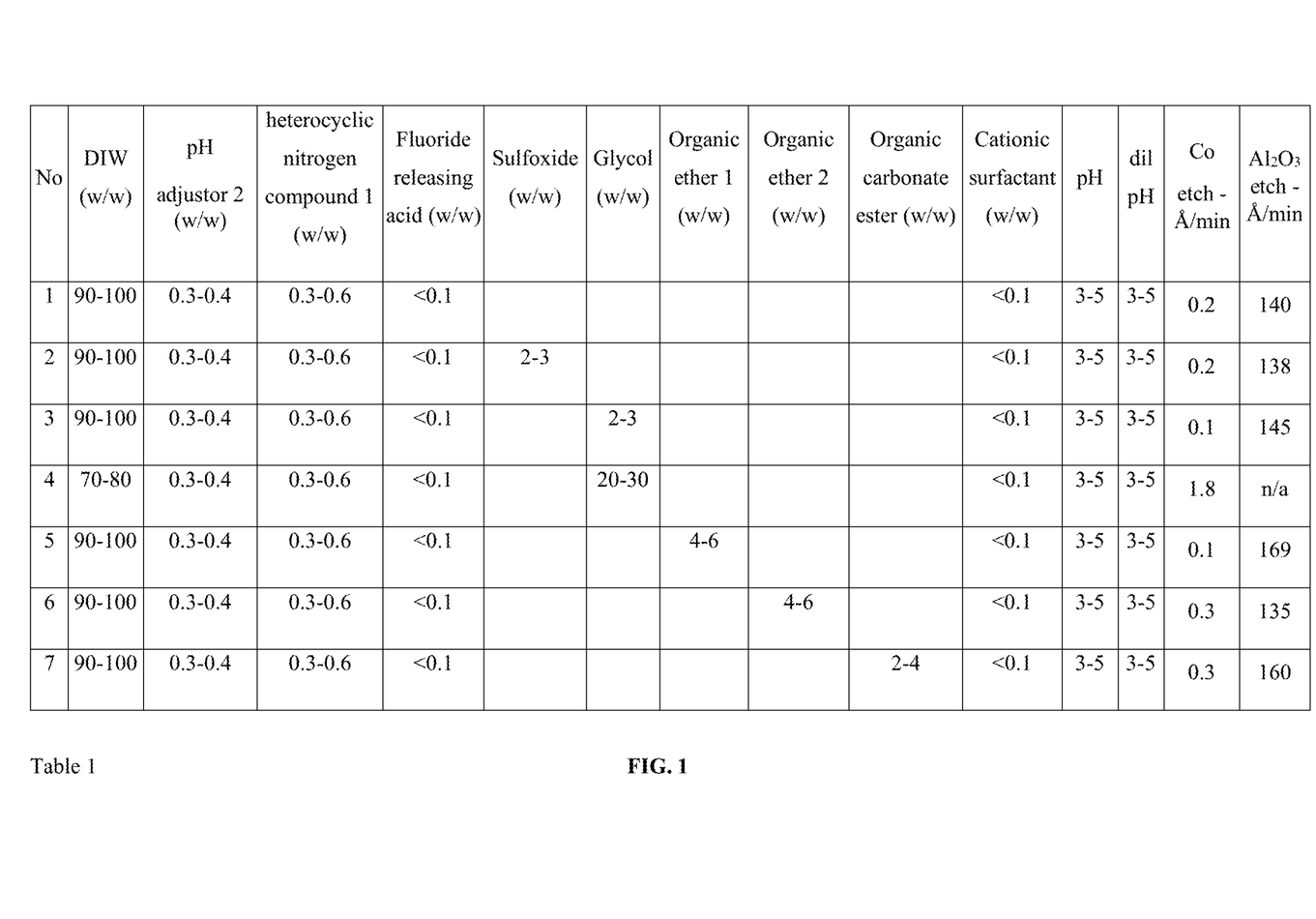
FIG. 1 is Table 1 includes various compositions that were prepared as exemplary for this invention.
Figure 2:
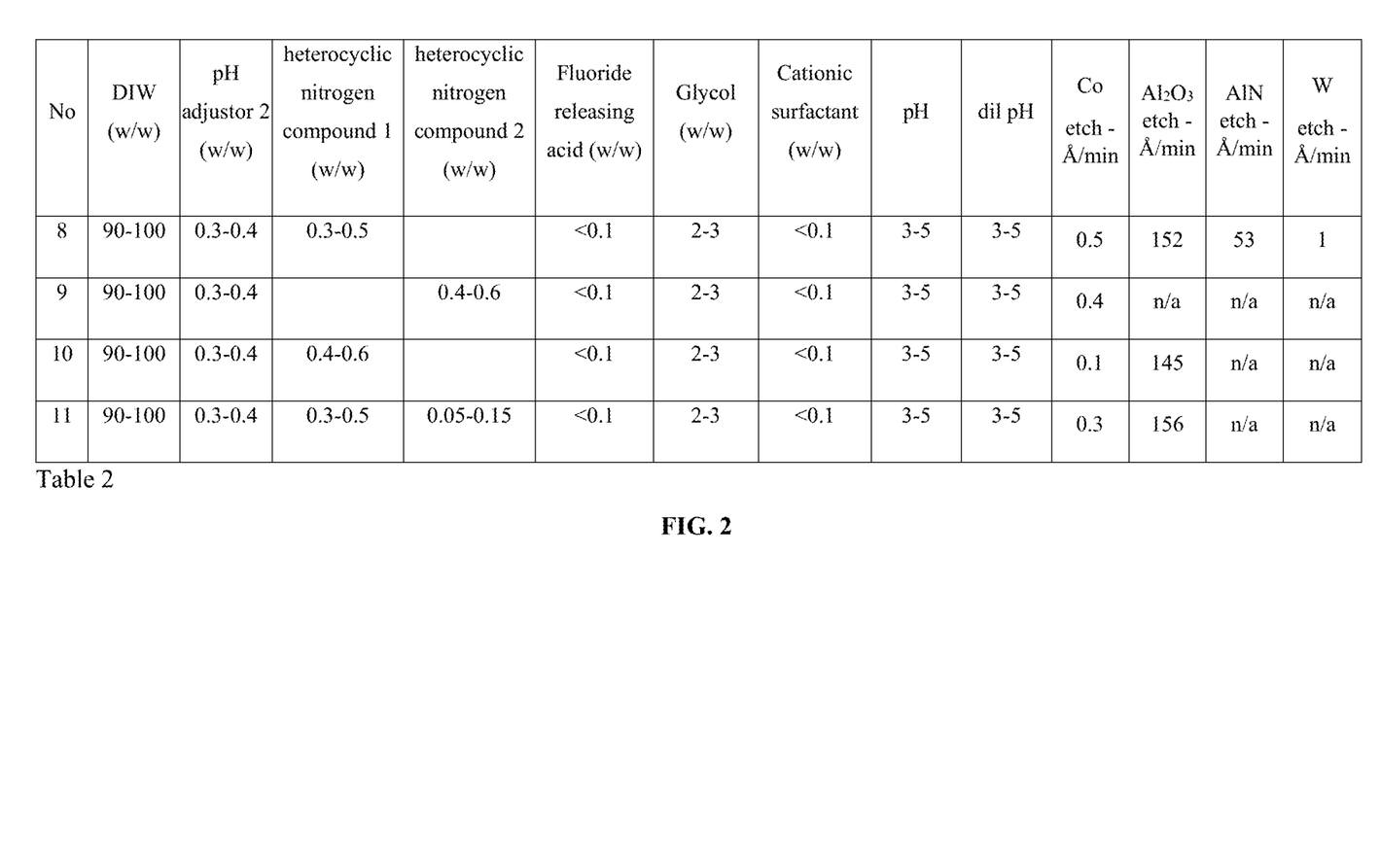
FIG. 2 is Table 2 includes various compositions that were prepared as exemplary for this invention.
Figure 3:
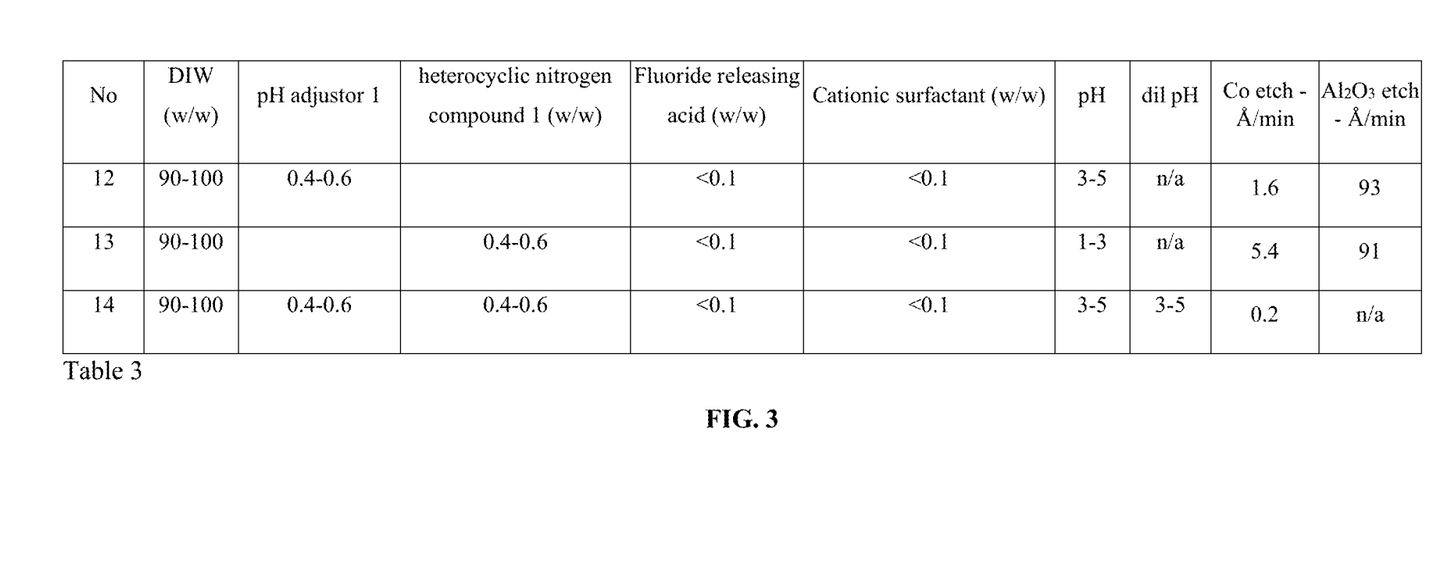
FIG. 3 is Table 3 includes various compositions that were prepared as exemplary for this invention.

Various compositions were prepared, as shown in FIG. 1, FIG. 2, and FIG. 3, and their pH measured. Each formulation was then diluted ×10 by adding 5 g of the formulation to 45 g of DIW. The pH of the ×10 diluted formulations was determined (dil pH).

Etch rates of the compositions were studied. In each of the etch rate test a coupon of the relevant material was inserted into the composition at a predetermined temperature for the following times: Co—15 mins; Al2O3—0.5 mins; AlN—0.5 mins; W—2 mins.

The extent of etching that occurred was measured by XRF (ZSX-400 from Rigaku Co.).

Study 1

Referring to FIG. 1, seven compositions (1 to 7) as shown in Table 1 were prepared. The compositions each included an etchant comprising a source of fluoride ("fluoride releasing acid"), metal corrosion inhibitor ("heterocyclic nitrogen compound 1", "cationic surfactant"), a pH buffering agent ("pH adjustor 2") and water.

Compositions 2 to 7 additionally included solvents ("Sulfoxide", "Glycol", "Organic ether 1", "Organic ether 2", "Organic carbonate ester") to help increase chemical wetting for residue removal. The pH of each of the compositions was in the range of from 3 to 5.

Etch rates for cobalt were low for each of compositions 1, 2, 3, 5, and 6 and 7. Notably, the etch rate for cobalt was higher for composition 4, which contained higher levels of glycol. Aluminium oxide etch rates were high for each of compositions 1, 2, 3, 5 and 6 and 7. The aluminium oxide eth rate of composition 4 was not tested.

Study 2

Referring to FIG. 2, four additional compositions (8 to 11) as shown in Table 2 were prepared. The compositions each included an etchant comprising a source of fluoride ("fluoride releasing acid"), metal corrosion inhibitor ("heterocyclic nitrogen compound 1" or "heterocyclic nitrogen compound 2", "cationic surfactant"), a pH buffering agent ("pH adjustor 2"), an organic solvent ("glycol") and water.

Compared to composition 8, compositions 9 and 11 included different/additional metal corrosion inhibitor ("heterocyclic nitrogen compound 2" instead of "heterocyclic nitrogen compound 1"), whilst composition 10 included an increased concentration of "heterocyclic nitrogen compound 1". The pH of each of the compositions was in the range of from 3 to 5.

Etch rates for cobalt were low for each of compositions 8 to 11. Notably, a small improvement was witnessed when increasing the concentration of "heterocyclic nitrogen compound 1". Aluminium oxide etch rates were high where tested.

Study 3

Referring to FIG. 3, three additional compositions (12 to 14) as shown in Table 3 were prepared. The compositions each included an etchant comprising a source of fluoride ("fluoride releasing acid"), metal corrosion inhibitor ("cationic surfactant") and water.

The impact of adding a further type of metal corrosion inhibitor ("heterocyclic nitrogen compound 1") and pH buffering agent ("pH adjustor 1") were tested. It was found that the combination of pH buffering agent and further metal corrosion inhibitor significantly reduced cobalt etch rate.

The invention claimed is:

1. A method of selectively removing aluminum oxide or nitride material, the method comprising:
   i) contacting the material with an aqueous etching composition comprising:
      an etchant in an amount in a range of from 0.001 to 0.5 wt./wt. % based on the total weight of the composition, the etchant comprising a source of fluoride;
      a pH buffering agent in an amount in a range of from 0.01 to 2.0 wt./wt. % based on the total weight of the composition;
      a metal corrosion inhibitor in an amount in a range of from 0.0001 to 2.0 wt./wt. % based on the total weight of the composition; and
      a cationic surfactant corrosion inhibitor or a quat metal corrosion inhibitor comprising a quaternary ammonium cation of formula (I):

wherein $R^1$, $R^2$, $R^3$ and $R^4$ are independently selected from quaternizing groups, and wherein $R^4$ comprises at least 8 carbon atoms, wherein the composition has a pH in the range of from 3 to 8; and
ii) selectively removing the aluminum oxide or nitride material relative to a metal.

2. The method of claim 1, wherein the etchant is selected from HF, ammonium fluoride and tetraalkylammonium fluorides.

3. The method of claim 1, wherein the amount of etchant in the composition is in the range of from 0.01 to 0.1 wt./wt. % based on the total weight of the composition.

4. The method of claim 1, wherein the metal corrosion inhibitor comprises a heterocyclic nitrogen compound.

5. The method of claim 4, wherein the metal corrosion inhibitor comprises an optionally substituted benzotriazole.

6. The method of claim 5, wherein the amount of optionally substituted benzotriazole corrosion inhibitor in the composition is in the range of from 0.1 wt./wt. % to 1 wt./wt. % based on the total weight of the composition.

7. The method of claim 1, wherein the quaternizing group includes a substituted or unsubstituted alkyl, alkoxy, or aryl group.

8. The method of claim 1, wherein the quat metal corrosion inhibitor comprises a quaternary ammonium cation of formula II:

wherein n is 8, 10, 12, 14, 16, or 18.

9. The method of claim 1, wherein $R^1$ comprises a substituted or unsubstituted aryl quaternizing group, and/or wherein $R^2$ and $R^3$ are independently selected from substituted or unsubstituted alkyl groups having in the range of from 1 to 5 carbon atoms.

10. The method of claim 1, wherein the quat metal corrosion inhibitor comprises benzyldimethyldodecylammonium chloride.

11. The method of claim 1, wherein the amount of quat metal corrosion inhibitor in the composition is in the range of from 0.001 wt./wt. % to 0.01 wt./wt. % based on the total weight of the composition.

12. The method of claim 1, wherein the composition has a pH in the range of from 3 to 5.

13. The method of claim 1, wherein the pH buffering agent comprises ammonium acetate.

14. The method of claim 1, wherein the composition comprises an organic solvent selected from the group consisting of a sulfoxide, a glycol, an ether, and a carbonate ester.

15. The method of claim 1, able to achieve one or more of the following:
an aluminum nitride etch rate of at least 50 Angstroms/minute
a tungsten etch rate of at most 4 Angstroms/minute
a cobalt etch rate of at most 4 Angstroms/minute
a low-k dielectric etch rate of at most 4 Angstroms/minute.

16. The method of claim 1, wherein the metal is tungsten, copper, cobalt, or ruthenium.

* * * * *